United States Patent
Ling et al.

(10) Patent No.: US 9,213,593 B2
(45) Date of Patent: Dec. 15, 2015

(54) EFFICIENT MEMORY ARCHITECTURE FOR LOW DENSITY PARITY CHECK DECODING

(71) Applicant: MaxLinear, Inc., Carlsbad, CA (US)

(72) Inventors: Curtis Ling, Carlsbad, CA (US); Timothy Gallagher, Encinitas, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 64 days.

(21) Appl. No.: 14/156,727

(22) Filed: Jan. 16, 2014

(65) Prior Publication Data

US 2014/0201593 A1 Jul. 17, 2014

Related U.S. Application Data

(60) Provisional application No. 61/753,167, filed on Jan. 16, 2013.

(51) Int. Cl.
*G06F 11/10* (2006.01)
*H03M 13/11* (2006.01)
*H03M 13/15* (2006.01)
*H03M 13/29* (2006.01)

(52) U.S. Cl.
CPC ....... *G06F 11/1012* (2013.01); *H03M 13/1105* (2013.01); *H03M 13/1102* (2013.01); *H03M 13/152* (2013.01); *H03M 13/2906* (2013.01)

(58) Field of Classification Search
CPC .......... G06F 11/1102; H03M 13/1105; H03M 13/152; H03M 13/2906; H03M 13/255; H03M 13/1165; H03M 13/271; H03M 13/116; H03M 13/1102; H03M 13/1117; H03M 13/1137; H04L 1/0057; H04L 1/0071
USPC ........................................................ 714/758
See application file for complete search history.

(56) References Cited

U.S. PATENT DOCUMENTS

| | | | |
|---|---|---|---|
| 8,880,973 B1* | 11/2014 | Li et al. | 714/752 |
| 2003/0104788 A1* | 6/2003 | Kim | 455/67.3 |
| 2005/0160351 A1* | 7/2005 | Ko et al. | 714/801 |
| 2008/0118229 A1* | 5/2008 | Bliss | 386/123 |
| 2008/0276156 A1* | 11/2008 | Gunnam et al. | 714/801 |
| 2010/0037121 A1* | 2/2010 | Jin et al. | 714/763 |
| 2010/0074342 A1* | 3/2010 | Shental et al. | 375/259 |

(Continued)

OTHER PUBLICATIONS

Muller, Stefan et al., A Novel LDPC Decoder for DVB-S2 IP dated Apr. 20, 2009.

*Primary Examiner* — James C Kerveros (74) *Attorney, Agent, or Firm* — McAndrews, Held & Malloy, Ltd.

(57) ABSTRACT

A low density parity check (LDPC) decoder integrated on a single semiconductor substrate may comprise one or more arrays of first-type memory cells and one or more arrays of second-type memory cells. The LDPC decoder may be configured to store intrinsic messages in the array of first-type cells and to store extrinsic messages in the array of second-type cells. The first-type cells may be a first one of: static random access memory (SRAM) cells, refreshed dynamic random access memory (DRAM) cells, non-refreshed DRAM cells configured as a FIFO, and non-refreshed DRAM cells not configured as a FIFO. The second-type cells may be a second one of: static random access memory (SRAM) cells, refreshed dynamic random access memory (DRAM) cells, non-refreshed DRAM cells configured as a FIFO, and non-refreshed DRAM cells not configured as a FIFO.

15 Claims, 8 Drawing Sheets

(56) References Cited

U.S. PATENT DOCUMENTS

| | | |
|---|---|---|
| 2010/0251059 A1* | 9/2010 | Dielissen .................... 714/752 |
| 2010/0275100 A1* | 10/2010 | Yokokawa et al. .......... 714/763 |
| 2013/0173994 A1* | 7/2013 | Liu et al. .................... 714/769 |
| 2013/0254617 A1* | 9/2013 | Shinohara et al. .......... 714/752 |
| 2013/0275827 A1* | 10/2013 | Wang et al. ................. 714/752 |
| 2013/0297992 A1* | 11/2013 | Yamamoto et al. .......... 714/776 |
| 2014/0082449 A1* | 3/2014 | Zhang ........................ 714/752 |
| 2014/0164866 A1* | 6/2014 | Bolotov et al. .............. 714/758 |

* cited by examiner

EFFICIENT MEMORY ARCHITECTURE FOR LOW DENSITY PARITY CHECK DECODING

PRIORITY CLAIM

This application claims priority to the following application(s), each of which is hereby incorporated herein by reference:
U.S. provisional patent application 61/753,167 titled "Efficient Memory Architecture for Low Density Parity Check Decoding" filed on Jan. 16, 2013.

BACKGROUND OF THE INVENTION

Conventional systems and methods for communications can be overly power hungry, slow, expensive, and inflexible. Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Systems and methods for communications, substantially as shown in and/or described in connection with at least one of the figures, as set forth more completely in the claims.

Advantages, aspects and novel features of the present disclosure, as well as details of various implementations thereof, will be more fully understood from the following description and drawings.

DETAILED DESCRIPTION OF THE INVENTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Figure 1:
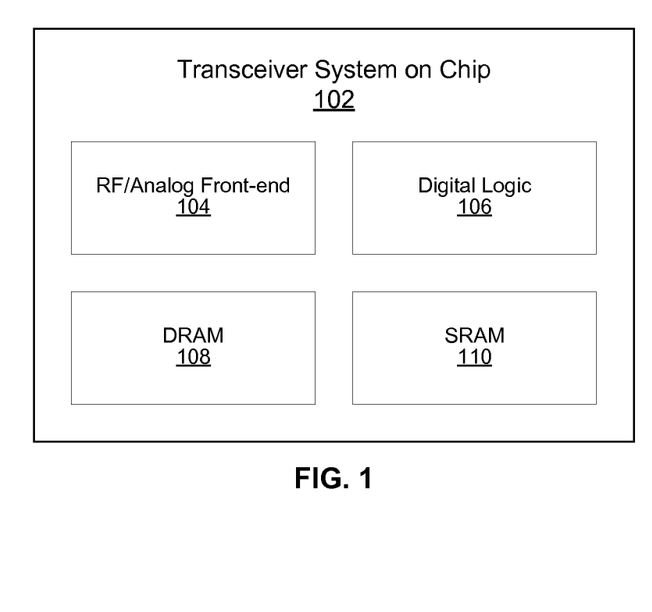
FIG. 1 depicts an example communication system comprising memory cells optimized for use in an error-tolerant system.

FIG. 1 depicts an example communication system comprising memory cells optimized for use in a communications system. In the example implementation depicted, the communication system comprises a system on chip (SoC) 102. For example, the SoC 102 may be integrated on a single silicon die. The SoC 102 comprises an RF/Analog front-end circuit 104, digital logic 106, one or more arrays of dynamic random access memory (DRAM) 108, one or more arrays of static random access memory (SRAM).

The front-end circuit 104 is operable to interface the SoC 102 to a communication medium (e.g., wired bus or cable, optical fiber, or wireless channel). In instances that the front-end 104 is configured for reception, it may comprise, for example, a low noise amplifier, a mixer, a filter, and an analog to digital converter. In instances that the front-end 104 is configured for transmission, it may comprise, for example, a digital to analog converter, a filter, a mixer, and a power amplifier.

Figure 2A:
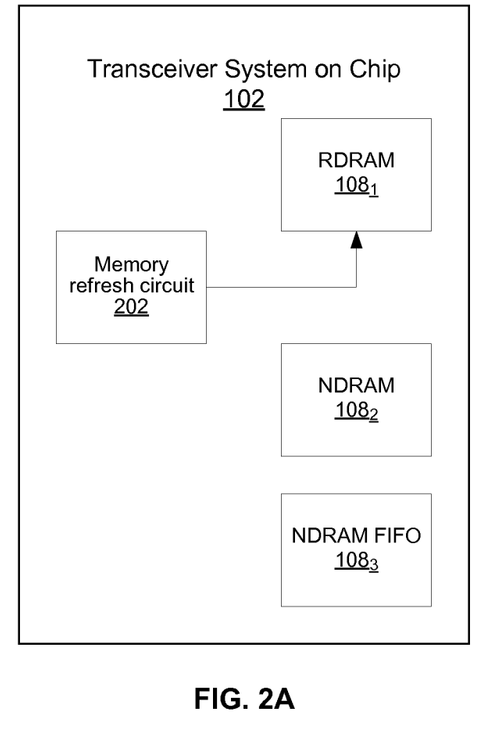
FIG. 2A is a block diagram illustrating a system comprising "non-refreshed" dynamic random access memory (NDRAM) and "refreshed" dynamic random access memory (RDRAM).
Figure 3:
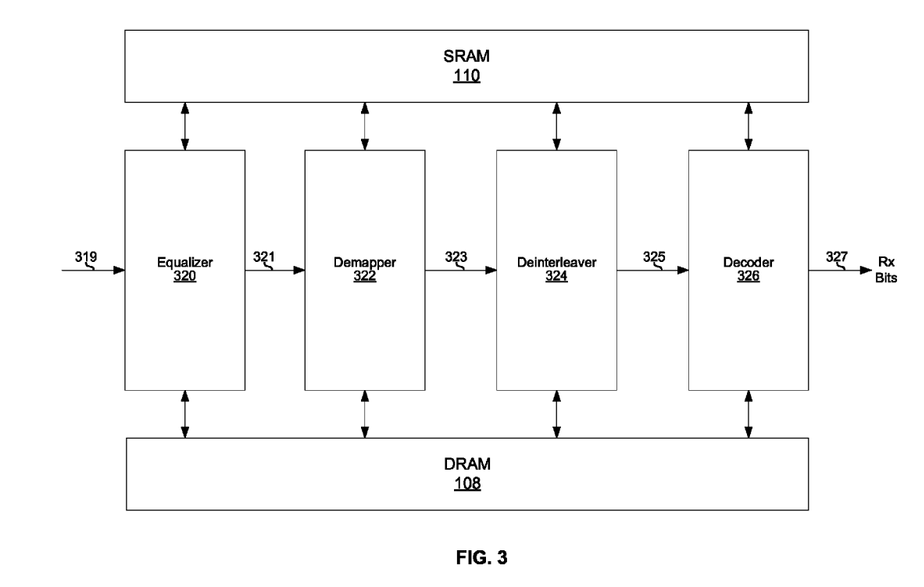
FIG. 3 is an example receiver system in which RDRAM is used for storing bits that are replaced/overwritten slowly/infrequently, whereas NDRAM is used for storing bits that are replaced/overwritten quickly/frequently.

The digital logic 112 may comprise transistors configured to implement digital functions such as a CPU, memory refresh circuit 202 (FIG. 2), and the equalizer 320, demapper 322, deinterleaver 324, and decoder (326) (FIG. 3).

Figure 2B:
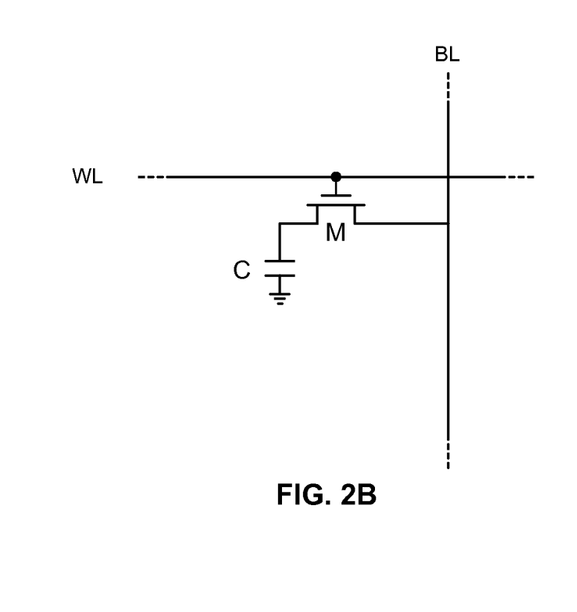
FIG. 2B depicts an example one-transistor ("1T") DRAM cell.
Figure 2C:
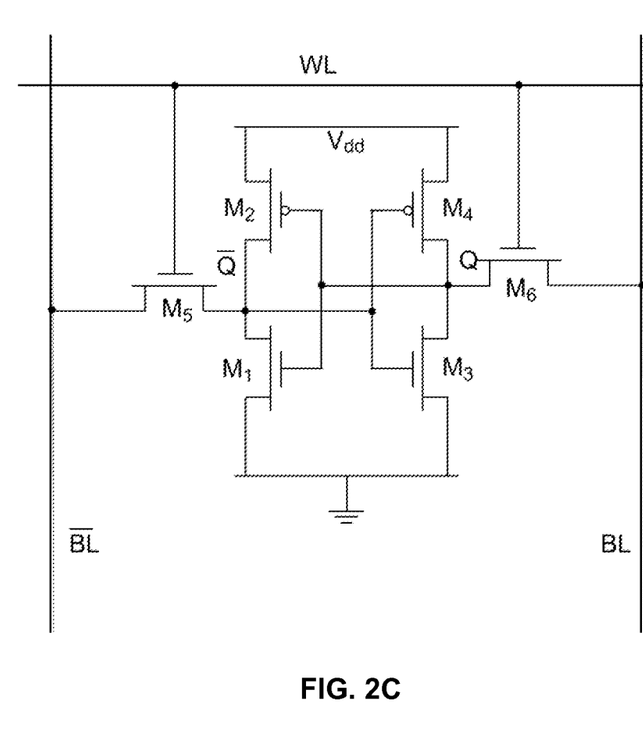
FIG. 2C depicts an example six-transistor ("6T") SRAM cell.

The SRAM 110 comprises one or more arrays of SRAM memory cells. The arrays may range in size from a single-bit to multiple megabits, or more. For example, each array of SRAM cells may comprise one or more pages/rows distributed across one or more banks, with each page/row consisting of one or more columns, each column corresponding to particular address, and each column consisting of one or more cells. As another example, an array of SRAM may comprise a single latch or flip-flop. In an example implementation, each SRAM cell of the SoC 102 may be a six-transistor ("6T") cell, such as is shown in FIG. 2C. The transistors, $M_1$ through $M_6$, of each SRAM cell on the SoC 102 may be realized using the same fabrication process and same process design rules as the digital logic 106.

Referring back to FIG. 1, the DRAM 108 comprises one or more arrays of DRAM memory cells. The arrays may range in size from a single-bit to multiple megabits, or more. For example, each array of DRAM cells may comprise one or more pages/rows distributed across one or more banks, with each page/row consisting of one or more columns/addresses, and each column/address consisting of one or more cells. In an example implementation, each DRAM cell may be a one-transistor ("1T") cell, such as is shown in FIG. 2B. The transistor M and capacitor C of each DRAM cell on the SoC 102 may be realized using the same fabrication process and same process design rules as the digital logic 106 and the memory cells of SRAM 110. This is in contrast to conventional embedded DRAM cells which are fabricating use specialized semiconductor processes and/or additional processing steps.

A DRAM cell stores a bit as the presence or absence of an electric charge on a capacitor. Because this charge inevitably leaks away due to non-idealities, eventually (after some time duration D) enough charge will leak away that the value of the bit is no longer sufficiently reliable (e.g., probability of error is greater than some determined threshold $T_{ERR}$). The value of $T_{ERR}$ is implementation dependent and based on, for example: a number of symbol errors than can be corrected or compensated for by system components such as decoder 326 (FIG. 3); a target metric such as a threshold symbol error rate (SER), a threshold bit error rate (BER), a threshold signal to noise ratio (SNR), or the like (e.g., set forth in a standard with which the SoC 102 is to comply and/or determined by a required quality of service); and/or end user experience (e.g., in a video scenario, a number of symbol errors that can be tolerated before the picture is visibly degraded). To prevent loss of stored information, DRAM cells are conventionally refreshed at intervals of duration less than $D_{min}$, where $D_{min}$ is a value of D set for worst-case conditions. In effect, a refresh of a DRAM cell comprises reading the cell and immediately writing the read value back to the cell (restoring the amount of charge on the capacitor).

For purposes of this disclosure, it is assumed that all DRAM cells of the SoC 102 have substantially the same layout (e.g., same transistor size, capacitor size, arrangement/orientation, and/or the like). Consequently, it is assumed that each of the DRAM cells is characterized by the same value of D for a particular $T_{ERR}$. In other implementations, any cell(s) of DRAM 108 may be sized differently than any other cell(s) of the DRAM 108 based on various factors such as, for example: different values of $T_{ERR}$ for different cells, the rate of change/replacement of information that the cell is to store, and whether the cell(s) is/are to operate as an RDRAM, as NDRAM not configured as a FIFO or shift register, or as NDRAM configured as a FIFO or shift register (the differences between these is explained below).

Referring now to FIG. 2A, Shown are arrays $108_1$-$108_3$ of the one or more DRAM 108, and a memory refresh circuit 202 of the digital logic 106.

The DRAM array $108_1$ is coupled to memory refresh circuit 204 and the memory refresh circuit 202 may be dedicated circuitry for performing refreshes of the array $108_1$. The array $108_1$ is accordingly referred to herein as "refreshed DRAM (RDRAM)". In an example implementation, the SoC 102 may not comprise any RDRAM cells and may, therefore, not comprise any DRAM refresh circuit.

There is no refresh circuitry coupled to the arrays $108_2$ and $108_3$. These arrays are accordingly referred to herein as "non-refreshed DRAM (NDRAM)." Consequently, if a value sits in a cell of NDRAM for longer than D, the probability of that value being unreliable due to leakage may increase beyond $T_{ERR}$. If, however, new values are written to a cell of NDRAM at intervals that are shorter in duration than D, then the probability of an error due to leakage may remain below $T_{ERR}$, and significant time, power, and/or area overhead may be saved by not refreshing memory arrays $108_2$ and $108_3$ and not having any refresh circuitry dedicated for memory arrays $108_2$ and $108_3$.

Because the arrays $108_2$ and $108_3$ are not refreshed, data sitting on a cell of these arrays for longer than D can lead to corruption of the data on that cell with probability greater than $T_{ERR}$. It is often the case, however, that although any particular cell of an array may not be written to at intervals less than D, at least one cell of the array is written to every less than D seconds. For such use cases, the array $108_3$ may be used to prevent data corruption due to leakage. In this regard, array $108_3$ is configured as a first-in-first-out (FIFO) or shift register such that, each time a new value is written to any cell of the memory, the previously stored values are shifted such that all memory cells are written. While such a configuration may consume more power than the NDRAM array $108_2$, which is not configured as a FIFO, trading off power consumption to achieve area gains (relative to array of an SRAM or RDRAM array having the same number of cells) may be desirable in some instances.

Figure 2D:
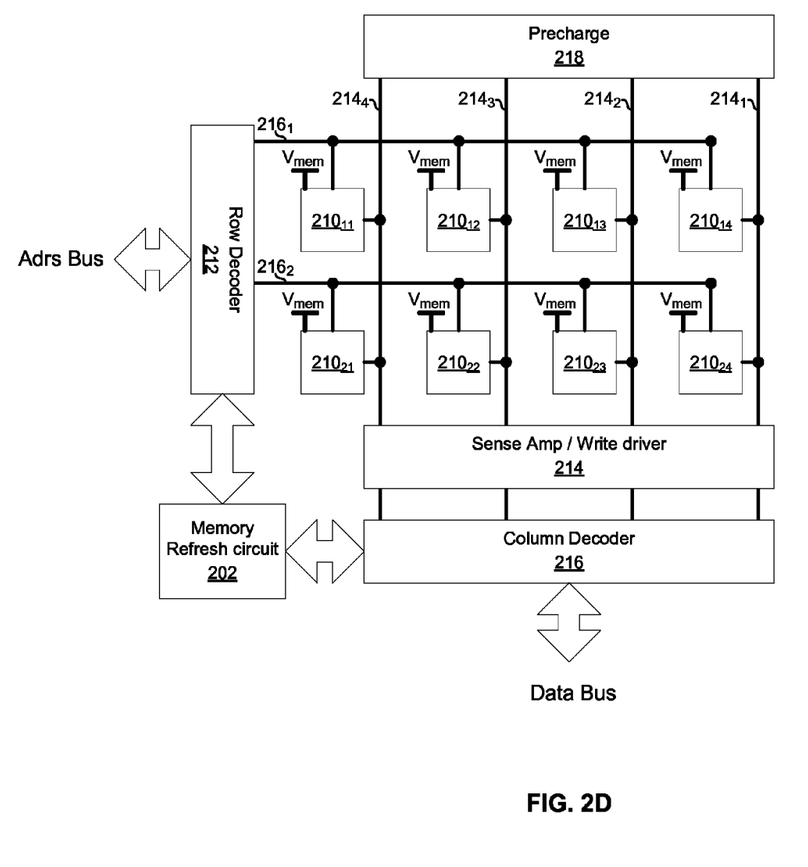
FIG. 2D depicts an example array of DRAM cells and accompanying control circuitry.

FIG. 2D depicts an example array of DRAM cells and accompanying control circuitry. Shown is a plurality (eight, chosen arbitrarily for illustration) of DRAM cells $210_{RC}$ (where R is the row of the cell and C is the column of the cell) coupled to bit lines $214_1$-$214_4$ and word lines $216_1$-$216_2$, which in turn couple the cells to row decoder 212 and sense amplifier/write driver 214. The row decoder 212 is coupled to the address bus. The outputs/inputs of the sense amplifier/write driver 214 are coupled to the column decoder 216, which in turn is coupled to the data bus. When the array of FIG. 2D is RDRAM, the memory refresh circuit 202 periodically refreshes the memory. When the array of FIG. 2D is NDRAM, the memory refresh circuit 202 is either not instantiated on the SoC 102, or is disabled where the array is configured to be operated as either NDRAM or RDRAM as circumstances dictate.

Figure 2E:
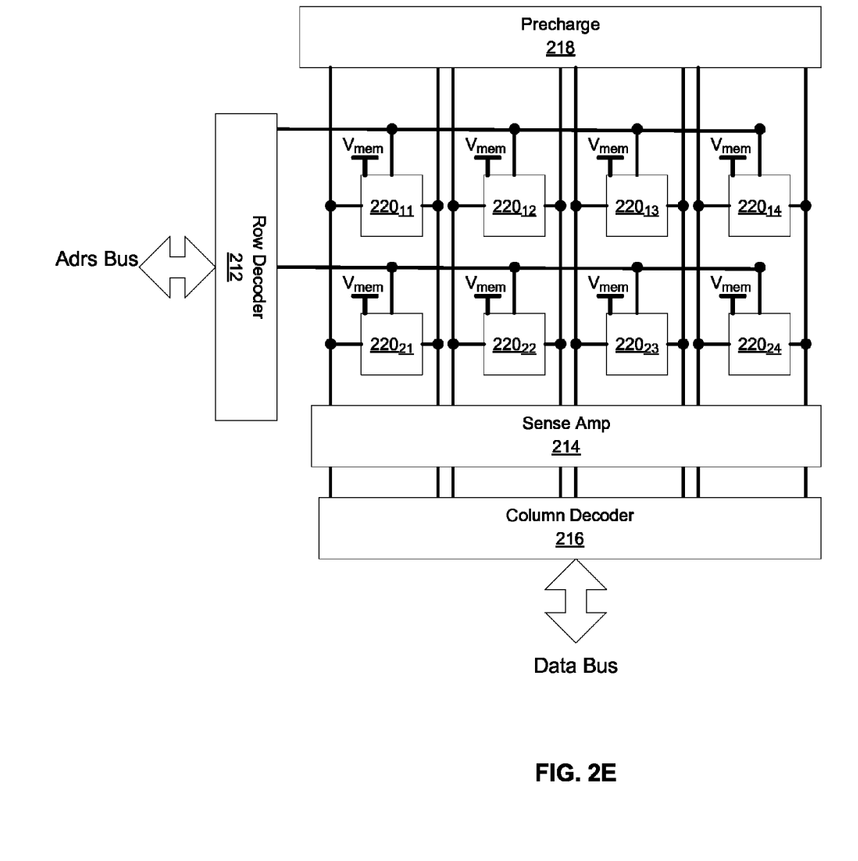
FIG. 2E depicts an example array of SRAM cells and accompanying control circuitry.

FIG. 2E depicts an example array of SRAM cells and accompanying control circuitry. The circuitry shown in FIG. 2E is similar to FIG. 2D except there is no memory refresh circuit 202 (SRAM does not require refresh) and the bit lines are differential (although single-ended SRAM is possible).

FIG. 3 is an example receiver system in which RDRAM is used for storing bits that are replaced/overwritten slowly/infrequently, whereas NDRAM is used for storing bits that are replaced/overwritten quickly/frequently. Shown in FIG. 3, is an equalizer 320, a demapper 322, a deinterleaver 324, and a decoder 326. The components of FIG. 3 may, for example, reside in an example implementation of digital logic 106.

Operations performed by each of the equalizer 320, demapper 322, deinterleaver 324, and decoder 326 may be configured by configuration parameters which are updated/replaced at a rate slower than 1/D (e.g., they may be static or updated only once per span of many symbol periods). Since a corrupted configuration parameter could potentially result in corruption of every received symbol, the configuration parameters may be stored in RDRAM cells of DRAM 108 and/or SRAM 110 to prevent them from being corrupted due to cell leakage. Similarly, operations performed by each of the equalizer 320, demapper 322, deinterleaver 324, and decoder 326 may be controlled by a series of instructions which are updated/replaced at a rate slower than 1/D (e.g., they may be static or updated only upon initialization of the SoC 102). Accordingly, since a corrupted instruction could potentially result in corruption of every symbol, RDRAM cells of DRAM 108 and/or SRAM 110 (or ROM, not shown) may be used as program memory for storing the instructions to prevent the instructions from being corrupted due to cell leakage.

The signal 319 is, for example, an output of front-end 104 (FIG. 1). The signal 319 is a digital signal with symbol rate S and symbol period 1/S.

The equalizer 320 is operable to process the signal 319 to generate signal 321. Such processing may comprise, for example, interference cancellation, level adjustment, filtering, and/or the like. The signals 319 and 321 are, for example, digital signals which carry symbols (e.g., QAM symbols, BPSK symbols, etc.). Values of the incoming data signal 319, values of the outgoing data signal 327, and temporary values generated/used during equalization, may be updated/replaced a rate faster than 1/D. Accordingly, such data values may be stored in NDRAM cells of DRAM 108 without increasing the probability of a critical amount of corruption of such data beyond a desired/required limit.

As an example, assuming that up to N (an integer) symbols of signal 319 are to be buffered in equalizer 320, then the data values in the buffer may be updated/replaced at a rate of S/N. When S (symbol rate) is sufficiently large and/or N is sufficiently small, then S/N>1/D and the buffering may be performed in NDRAM cells of 108 without increasing the probability of a critical amount of corruption of such data beyond a desired threshold. Conversely, when S is too small and/or N is too large, then S/N<1/D and the data may (depending on what is considered a critical amount of corruption for the particular implementation) need to be buffered in SRAM 110 or RDRAM cells of 108, or NDRAM cells of 108 configured as a FIFO to prevent a critical amount of corruption due to cell leakage.

The demapper 322 is operable to process the signal 231 to demap each of the symbols of signal 321 to one or more binary values, and output the binary values as signal 323. For example, the demapper 322 may map each N-QAM symbol of signal 321 to $\log_2(N)$ bits of signal 323. Values of the incoming data signal 319, values of the outgoing data signal 327, and temporary values generated/used during demapping, may be updated/replaced at a rate faster than 1/D. Accordingly, such data values may be stored in NDRAM cells of DRAM 108 without increasing the probability of a critical amount of corruption of such data beyond a desired/required limit.

The deinterleaver 324 is operable re-order the bits of signal 323 to undo reordering performed in a transmitter from which the signal 319 was received. In instances that interleaving is performed across boundaries of M (an integer) symbols, deinterleaving may require buffering M symbols worth of bits of the signal 323 and then completing rearrangement of those bits before the next M symbols arrive. Accordingly, a value may sit on a DRAM cell of the buffer for up to M symbol periods. Thus, if M/S is less than D, the buffering may be performed using NDRAM cells of the array $306_3$ without probability of corruption increasing above $T_{ERR}$. If M/S is greater than D, however, the buffering may be performed using SRAM cells of 110, RDRAM cells of 108, or NDRAM cells of 108 configured as a FIFO. Interleaving may also require temporarily storing bits that are currently being swapped. Typically, such temporary storage will be for less than D, and thus the NDRAM cells of 108 can be used.

The decoder 326 is operable to decode the signal 325 in accordance with one or more forward error correction (FEC) protocols/algorithms (e.g., Reed-Solomon, Turbo codes, Low Density Parity Check, and/or the like). The decoding may detect errors in the signal 325 and, in some instances, correct errors in the signal 325 such that outgoing data signal 327 contains fewer errors. In instances that an FEC codeword spans K (an integer) symbols, decoding may require buffering K symbols worth of bits of the signal 325 and then decoding those bits before the next K symbols arrive. Accordingly, a value may sit on a memory cell for up to K symbol periods. Thus, if K/S is less than D, the buffering may be performed using NDRAM cells of 108 without the probability of corruption exceeding $T_{ERR}$, and if K/S is greater than D, the buffering may be performed using SRAM cells of 110, RDRAM cells of 108, or NDRAM cells of 108 configured as a FIFO. Decoding may also require temporarily storing values generated during decoding (e.g., messages for a message passing LPDC decoder). Typically, such temporary storage will be for less than D, and thus the NDRAM cells of the array $306_4$ can be used. An example architecture for deinterleaving and decoding is described below with reference to FIGS. 4 and 5.

Other circuits which may use one or both of RDRAM and NDRAM include, for example, a circuit that performs a fast Fourier transform (FFT), a circuit that performs an inverse fast Fourier transform (IFFT), a filter (e.g., finite impulse response (FIR) or infinite impulse response (IIR)) memory, an analog-to-digital converter, a digital-to-analog converter, and/or the like.

Figure 4:
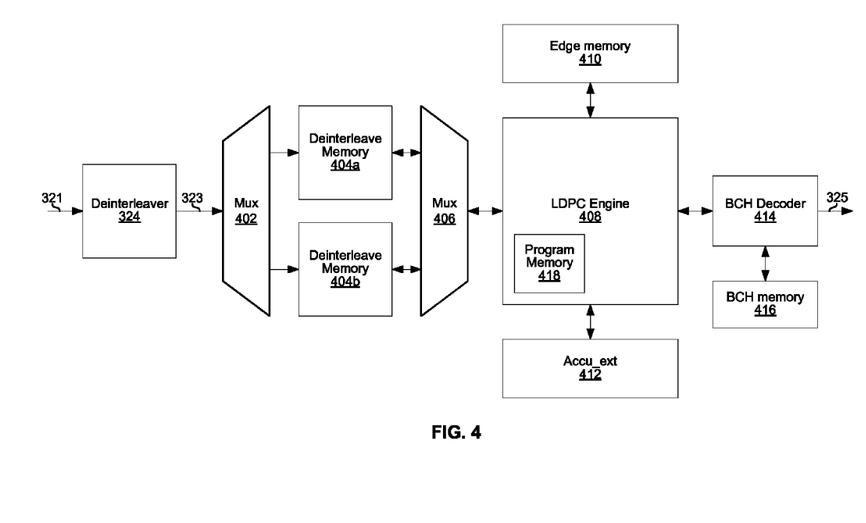
FIG. 4 depicts an example architecture for decoding using multiple types memory.

FIG. 4 depicts an example architecture for decoding using multiple types of memory. Shown is the deinterleaver 324, a multiplexer 402, deinterleaving memory arrays 404a and 404b, multiplexer/demultiplexer 406, LDPC engine 408, edge memory 410, accumulate and extension memory 412, Bose Chaudhuri Hocquenghem (BCH) decoder 414, and BCH memory 416.

The memory arrays 404a and 404b are used in ping pong fashion to buffer intrinsic messages (i.e., received symbols in binary form or as log-likelihood ratios) from the communication channel (received via deinterleaver 324). The edge memory 410 is used for storing extrinsic messages passed between check nodes and variable nodes of the LDPC engine 408. The accumulate and extension memory 412 is used for storing sums generated after each sub-iteration of the LPDC engine 408. Such iterations may complete rapidly. Each of the arrays of memory of 404a, 404b, 410, 412, and 416 may comprise any one or more SRAM cells, one or more RDRAM cells, one or more FIFO NDRAM cells, and/or one or more non-FIFO NDRAM cells.

In an example implementation, the memory arrays 404a and 404b may comprise SRAM cells, RDRAM cells, or NDRAM cells configured as FIFOs in order to support larger buffer depth (e.g., to accommodate long code words), the edge memory 410 may comprise non-FIFO NDRAM cells to take advantage of the fact that the extrinsic messages are written and read very rapidly (less than D between a write and corresponding read), and the accumulate and extension memory 412 may comprise non-FIFO NDRAM cells to take advantage of the fact that sub-iterations of the LDPC decoding are very short and thus updates occur frequently (at intervals less than D).

In an example implementation, the read and write speeds needed for the edge memory 410 may be faster than can be supported by DRAM. In such an implementation, the number of cells may be increased from A to B (e.g., B=2*A and the cells operated in a ping pong fashion). The size of B DRAM cells may still be less than A SRAM cells, thus resulting in an overall reduction in size of edge memory 410. Alternatively, SRAM (which typically supports higher speeds) may be used for the edge memory 410.

Upon completion of LDPC decoding of a codeword, the output may be a BCH codeword which is passed to the BCH decoder 414. The BCH decoder 414 operates using memory 416 in performing BCH decoding. The BCH decoding may comprise: (1) calculating the syndromes for the BCH codeword; (2) determining the number of errors and the error locator polynomial from the calculated syndromes; (3) calculating the roots of the error location polynomial to find the locations of the errors in the BCH codeword; (4) calculating the error values at those error locations; and (5) correcting the errors.

The BCH memory 416 may comprise SRAM cells, RDRAM cells, FIFO NDRAM cells, and/or non-FIFO NDRAM cells. In an example implementation, buffered BCH codeword may reside in memory for a relatively long time, and thus may be stored in SRAM or RDRAM. In an example implementation, syndromes, error locator polynomials, and roots of the polynomials may be read quickly after writing and may thus be stored in non-FIFO NDRAM cells.

Figure 5:
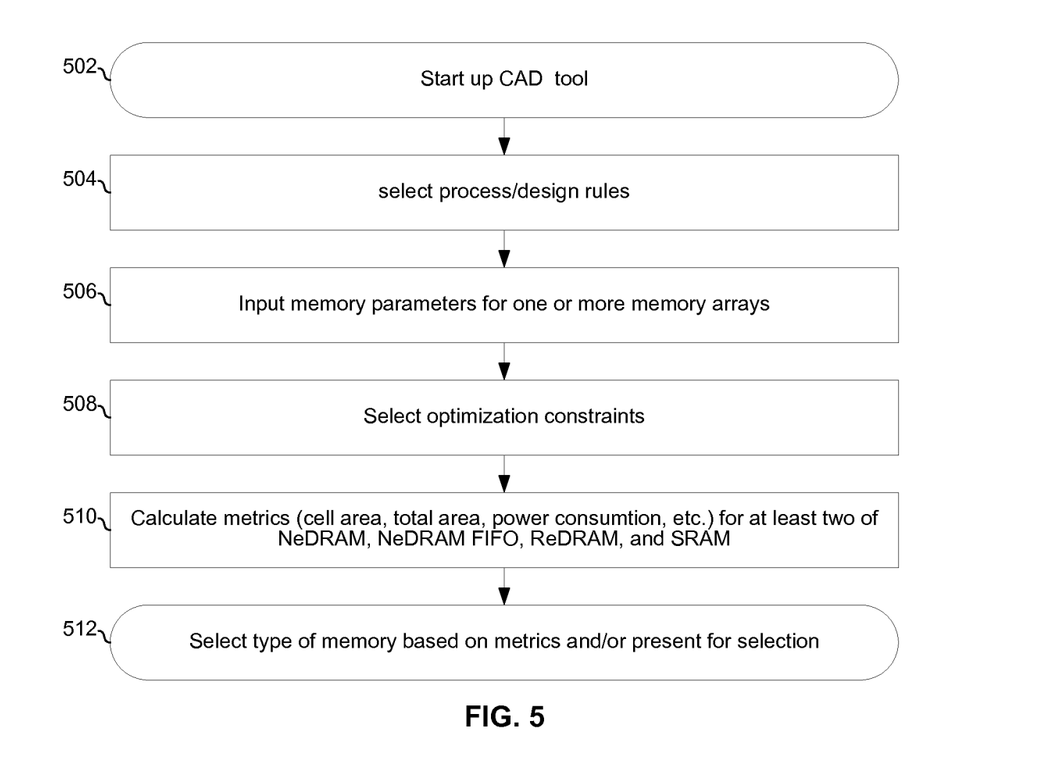
FIG. 5 is a flowchart illustrating an example process for architecting optimizing memory of a system on chip.

FIG. 5 is a flowchart illustrating an example process for architecting optimizing memory of a system on chip. In block 502, a computer aided design (CAD) tool configured with aspects of this disclosure is initialized and begins running on a computer or network of computers. In block 504, a user of the CAD tool selects a semiconductor process (e.g., a 40 nm process of a particular semiconductor manufacturer) and/or set of design rules to be used for fabricating the SoC 102. In block 506, the user inputs parameters (e.g., number of cells, required speed, maximum time between writes to any particular cell, tolerable $T_{ERR}$, and/or the like) for a memory array to be fabricated on the SoC 102 (e.g., for one or more of 404a, 404b, 410, 412, and 416). In block 508, the user selects one or more optimization constraints for the array. For example, the user may input power and/or area constraints for the array and/or may input whether the array is to be optimized for power, area, or some combination of the two. In block 510, the CAD tool calculates estimated metrics for the array for a variety of types of memory cells from which the array can be fabricated on the SoC 102. For example, the CAD tool may calculate the power and area of the array if it is realized using SRAM cells, using RDRAM cells, using FIFO NDRAM cells, and/or using non-FIFO DRAM cells. In block 512, CAD tool selects the type of cell to be used for realizing the array based on the calculated metrics and/or presents the calculated metrics such that user can decide which type of cell to use for realizing the array.

In various embodiments of this disclosure, a low density parity check (LDPC) decoder (e.g., FIG. 4) integrated on a single semiconductor substrate may comprise one or more arrays (e.g., 404a and 404b) of first-type memory cells and one or more arrays (e.g., 410) of second-type memory cells. The LDPC decoder may be configured to store intrinsic messages in the array of first-type cells and to store extrinsic messages in the array of second-type cells. The first-type cells may be a first one of: static random access memory (SRAM) cells, refreshed dynamic random access memory (DRAM) cells, non-refreshed DRAM cells configured as a FIFO, and non-refreshed DRAM cells not configured as a FIFO. The second-type cells may be a second one of: static random access memory (SRAM) cells, refreshed dynamic random access memory (DRAM) cells, non-refreshed DRAM cells configured as a FIFO, and non-refreshed DRAM cells not configured as a FIFO.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the methods described herein.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
a low density parity check (LDPC) decoder integrated on a single semiconductor substrate, said LDPC decoder comprising one or more arrays of static random access memory (SRAM) cells and one or more arrays of dynamic random access memory (DRAM) cells, wherein said LDPC decoder is configured to store intrinsic messages in said one or more arrays of SRAM cells and to store extrinsic messages in said one or more arrays of DRAM cells.

2. The system of claim 1, wherein each of said DRAM cells is a one-transistor ("1T") DRAM cell.

3. The system of claim 2, wherein said one or more arrays of DRAM cells are not refreshed by any refresh circuitry.

4. The system of claim 3, wherein said single semiconductor substrate does not comprise any memory refresh circuit for refreshing said one or more arrays of DRAM cells.

5. The system of claim 2, wherein each of said SRAM cells is a six-transistor ("6T") SRAM cell.

6. The system of claim 2, wherein a first portion of said one or more arrays of DRAM cells are not refreshed by any refresh circuitry and a second portion of said one or more arrays of DRAM cells are periodically refreshed by refresh circuitry.

7. The system of claim 1, wherein:
said DRAM cells are cells of a same semiconductor device fabrication process as said SRAM cells; and
said DRAM cells adhere to a same set of design rules as said SRAM cells.

8. The system of claim 1, wherein:
a deinterleaver is integrated on said single semiconductor substrate; and
said deinterleaver is configured to store bits being deinterleaved in said one or more arrays of SRAM cells.

9. A method comprising:
performing by a low density parity check (LDPC) decoder that is integrated on a single semiconductor substrate and comprising one or more arrays of static random access memory (SRAM) cells and one or more arrays of dynamic random access memory (DRAM) cells:
storing intrinsic messages in said one or more arrays of SRAM cells; and
storing extrinsic messages in said one or more arrays of DRAM cells.

10. The method of claim 9, wherein each of said DRAM cells is a one-transistor ("1T") DRAM cell.

11. The method of claim 10, wherein said one or more arrays of DRAM cells are not refreshed by any refresh circuitry.

12. The method of claim 10, wherein each of said SRAM cells is a six-transistor ("6T") SRAM cell.

13. The method of claim 9, wherein a first portion of said one or more arrays of DRAM cells are not refreshed by any refresh circuitry and a second portion of said one or more arrays of DRAM cells are periodically refreshed by refresh circuitry.

14. The method of claim 9, wherein:
said DRAM cells are cells of a same semiconductor device fabrication process as said SRAM cells; and
said DRAM cells adhere to a same set of design rules as said SRAM cells.

15. The method of claim 9, wherein a deinterleaver is integrated on said single semiconductor substrate, and said method comprises:
storing bits being deinterleaved by said deinterleaver in said one or more arrays of SRAM cells.

\* \* \* \* \*